United States Patent [19]
Lin

[11] Patent Number: 6,022,645
[45] Date of Patent: Feb. 8, 2000

[54] DOUBLE-SIDED PHOTOMASK

[75] Inventor: Benjamin Szu-Min Lin, Chiayi, Taiwan

[73] Assignee: United Microelectronics Corp., Taipei, Taiwan

[21] Appl. No.: 09/145,749

[22] Filed: Sep. 2, 1998

[30] Foreign Application Priority Data

Jun. 25, 1998 [TW] Taiwan ............................ 87110293

[51] Int. Cl.$^7$ ............................................. G03F 9/00
[52] U.S. Cl. ................................................. 430/5
[58] Field of Search ....................... 430/5, 22, 296; 378/34, 35

[56] References Cited

U.S. PATENT DOCUMENTS

| | | |
|---|---|---|
| 5,248,575 | 9/1993 | Ogoshi ............................ 430/5 |
| 5,358,809 | 10/1994 | Van Berkel ...................... 430/5 |
| 5,387,484 | 2/1995 | Doany et al. .................... 430/5 |
| 5,498,497 | 3/1996 | Kim et al. ........................ 430/5 |
| 5,733,686 | 3/1998 | Shimizu ............................ 430/5 |

*Primary Examiner*—S. Rosasco
*Attorney, Agent, or Firm*—Thomas, Kayden, Horstemeyer & Risley

[57] ABSTRACT

A double photomask includes two complementary pattern layers respectively formed on each surface of a transparent substrate. A full pattern is a combined pattern of these two complementary pattern layers. These two complementary pattern layers are formed separately on the different surfaces. The double-sided photomask also includes a shifter layer for a phase shifting mask.

17 Claims, 8 Drawing Sheets

DOUBLE-SIDED PHOTOMASK

CROSS-REFERENCE TO RELATED APPLICATION

This application claims the priority benefit of Taiwan application Ser. No. 87110293, filed Jun. 25, 1998, the full disclosure of which is incorporated herein by reference.

BACKGROUND OF THE INVENTION

1. Field of the Invention

This invention relates to a photomask structure, and more particularly to a structure of double-sided photomask.

2. Description of Related Art

Figure 1:
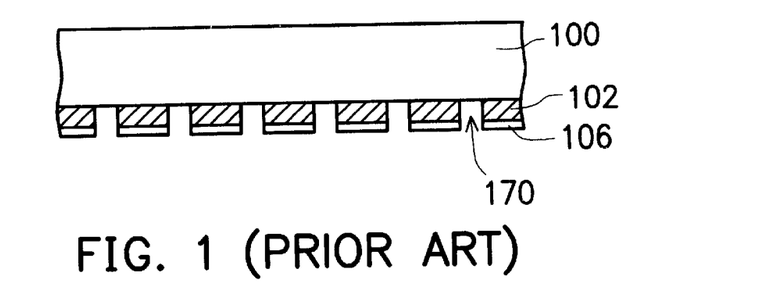
FIG. 1 is a cross-sectional view of a schematic conventional photomask.

A photomask is a key tool in photolithography process; it is used to transfer a desired pattern for fabrication. From this, it can be seen that the photomask plays an important role in the semiconductor fabrications. The photomask is composed of a flat transparent substrate and a light-shielding layer with a pattern, such as a circuit configuration, on the transparent substrate. FIG. 1 is a schematic, cross-sectional view of a conventional photomask. A transparent substrate 100 includes, for example, quartz or glass. A light-shielding layer 102, including, for example, chromium or metal, with a thickness of a few hundred Angstroms is formed over one surface of the transparent substrate 100. An exposing region 170, which is not covered by the light-shielding layer 102, exposes the transparent substrate 100. In order to reduce light reflection during an exposure process, an anti-reflection layer 106 with a thickness of about 200 Å is usually formed over the light-shielding layer 102.

Figure 2A:
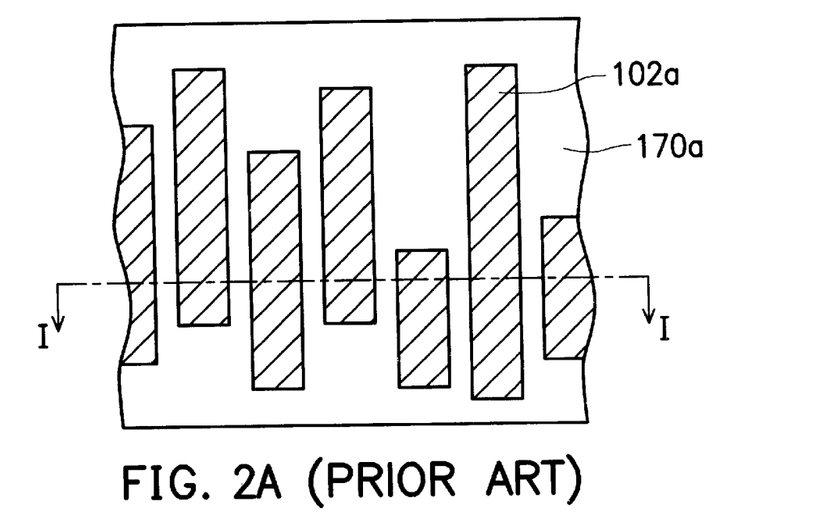
FIG. 2A is a bottom view schematically illustrating a conventional line photomask.
Figure 2B:
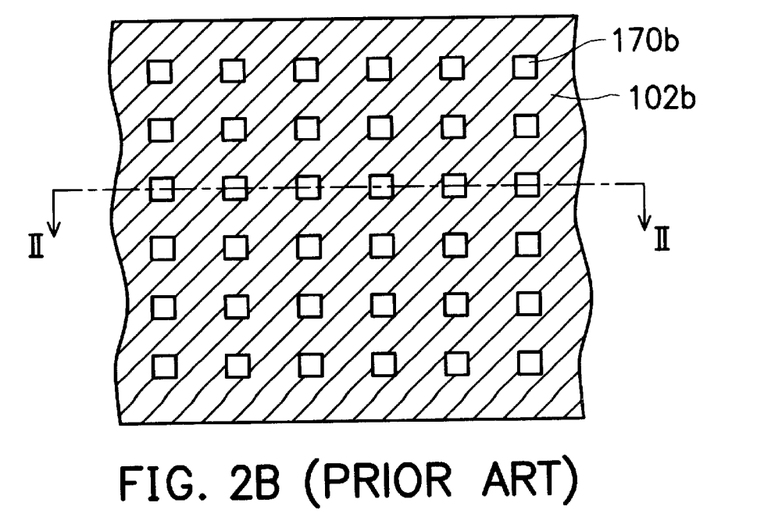
FIG. 2B is a bottom view schematically illustrating a conventional plug photomask.

FIG. 2A is a bottom view schematically illustrating a conventional line photomask. In FIG. 1 and FIG. 2A, the FIG. 1 is the cross-sectional view taken along the line I—I in FIG. 2A. A metal line 102a and an exposing region 170a correspond to the light-shielding layer 102 and the exposing region 170, respectively. The photomask shown in FIG. 2A is used for patterning a metal layer on a semiconductor substrate (not shown). FIG. 2B is a bottom view schematically illustrating a conventional plug photomask. In FIG. 1 and FIG. 2B, a cross-sectional view taken along the line II—II in FIG. 2B is shown in FIG. 1. A light-shielding layer 102b and a plug opening 170b correspond to the light-shielding layer 102 and the exposing region 170, respectively.

As the integration of an integrated circuit (IC) device is increased, a photolithography technology with high light resolution is required to achieve precise fabrication of the IC device. One solution proposes using a light source with shorter wavelength to meet this high light resolution requirement. A krypton fluoride laser is an example of an ultraviolet source with a wavelength of 2480 Å for exposure uses. However, a light source with a shorter wavelength can increase the light resolution but cause depth of focus (DOF) to be insufficient. Another solution to the need for high light resolution is to use a PSM in the photolithography process. The use of PSMs has become a trend and so manufacturers endeavor to devote a great deal of resources to the research and design PSMs.

A PSM uses a shifter layer formed over a typical photomask, in which the shifter layer can invert the wave phase of a light ray. When the PSM is exposed, the light rays that pass through the shifter layer have an inverted wave phase, which enables them to interfere with the other light rays. This results in a better pattern resolution in the patterns exposed on a semiconductor wafer. Even though fabrication of a PSM is complicated, the PSM has an advantage in that there is no need of a new light source to increase the pattern resolution due to a modification on a typical photomask.

FIG. 3, FIG. 4A, FIG. 5, and FIG. 6 are the cross-sectional views schematically illustrating four conventional phase shifting masks.

Figure 3:
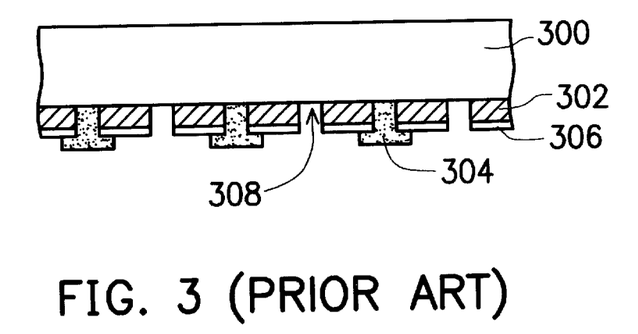
FIG. 3 is a cross-sectional view schematically illustrating a conventional alternating phase shifting mask.

An alternating PSM shown in FIG. 3 is used in a photolithography process. A transparent substrate 300 includes, for example, quartz. A light-shielding layer 302 including, for example, chromium metal is formed over one surface of the transparent substrate 300. Several exposing regions 308, which are not covered by the light-shielding layer 302, are formed sequentially in the cross-sectional view. An anti-reflection layer 306 including, for example, $CrO_2$ is formed over the light-shielding layer 302. A shifter layer 304 including, for example, $MoSi_ZO_XN_Y$ is formed over the transparent substrate 300 by filling alternating exposing regions 308. The shifter layer 304 can shift a light wave phase by a shift angle of 180°. The thickness of any shifter layer is typically set to have a shift angle of 180° to the exposing light source. In this arrangement of the shifter layer 304, the light rays passing through the exposing region 308 not filled with the shifter layer 304 interfere with the light rays passing through the shifter layer 304 at a critical region between the 0° phase light and the 180° phase light. Thus, a subtraction of the light wave amplitude occurs at the critical region, which is also called a zero point because the light intensity there is zero after amplitude subtraction. Resulting light intensity, obtained by taking the square of the light wave amplitude, has better light contrast so that pattern resolution is increased.

Figure 4A:
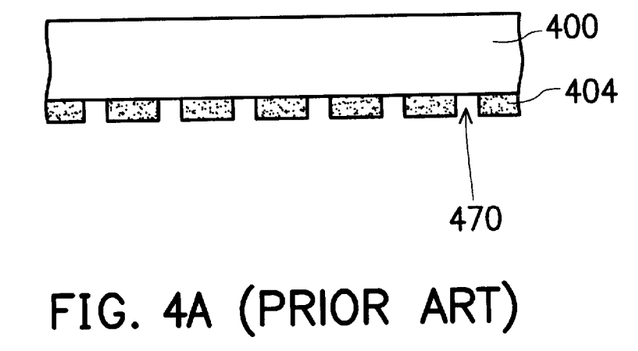
FIG. 4A is a cross-sectional view schematically illustrating a conventional half-tone phase shifting mask.
Figure 4B:
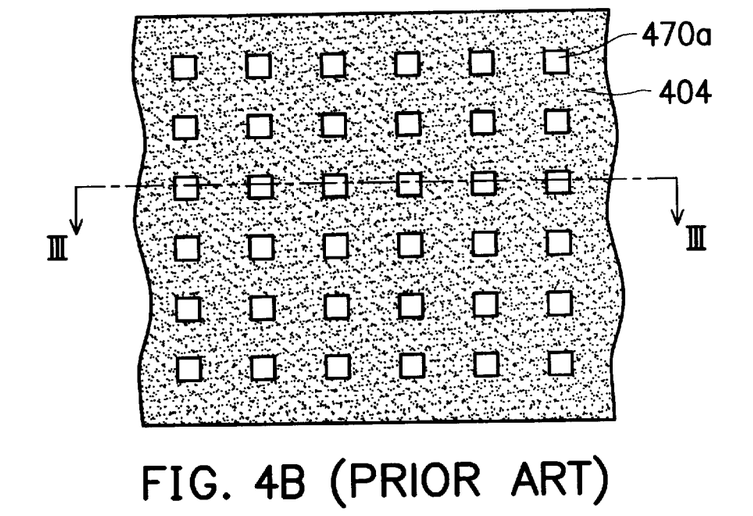

FIG. 4A is a cross-sectional view schematically illustrating a conventional half-tone phase shifting mask. FIG. 4B is a schematic bottom view of a conventional half-tone PSM (HTPSM). A cross-sectional view taken along the line of III—III is shown in FIG. 4A. In FIG. 4A and FIG. 4B, a shifter layer 404 and a number of openings 470 are formed on one surface of a transparent substrate 400. The openings 470 are called a hole pattern, which is commonly used in the photolithography process to pattern a contact opening (not shown) on a semiconductor substrate such that the patterning has a better depth of focus (DOF). The shifter layer 404 has a transmission coefficient of about 3–10% and can invert the light wave phase. When light is incident on the HTPSM, the light passing through the shifter layer 404 has a negative light wave amplitude due to inversion of the light wave phase. As described in FIG. 3, light wave amplitude compensation occurs at the critical region between the 0° phase light and the 180° phase light. Thus, the light intensity contrast is increased so that the pattern resolution is accordingly increased.

Figure 5:
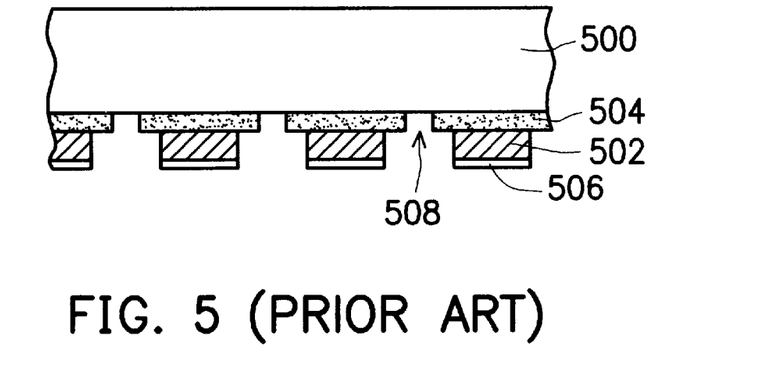
FIG. 5 is a bottom view schematically illustrating a conventional rim phase shifting mask.
Figure 6:
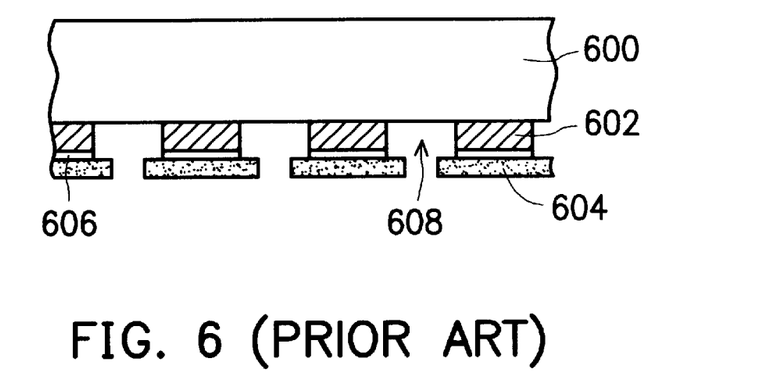
FIG. 6 is a bottom view schematically illustrating another conventional rim phase shifting mask.

A rim PSM is shown in FIG. 5 and FIG. 6. The rim PSM also uses a shifter layer to produce zero points in the pattern so that the pattern resolution is increased. In FIG. 5, the rim PSM is based on a transparent substrate 500. A shifter layer 504 is formed on one surface of the transparent substrate 500 with an exposing region 508, which exposes the transparent substrate 500. A light-shielding layer 502 is formed over the shifter layer 504 but exposes the rim of the shifter layer 504. Then an anti-reflection layer 506 is formed over the light-shielding layer 502. The properties of the shifter layer 504 and the anti-reflection layer 506 are the same as those of the previous descriptions. FIG. 6 shows another rim PSM, which is similar to the one shown in FIG. 5 except that the order of the shifter layer 604 is reversed. The shifter layers 504 and 604 produce zero points to increase the light intensity contrast.

However, as the integration of an integrated circuit (IC) device is increased, it is necessary to reduce device dimension and interconnect line width. In order to achieve high integration, a precise control on a critical dimension of IC devices is required to maintain a sufficient yield rate. The conventional photomasks are more and more incapable of obtaining precise control of the critical dimension. IC fabrication is therefore more difficult and is limited by the photomasks.

SUMMARY OF THE INVENTION

It is therefore an objective of the present invention to provide a double-sided photomask, which can reduce the difficulty and the limitations of the fabrication, and can improve pattern resolution to precisely control the critical dimension. The integration is then increased.

In accordance with the foregoing and other objectives of the present invention, the double-sided photomask comprises two complementary pattern layers respectively formed on each surface of a transparent substrate. A full pattern is a combined pattern of these two complementary pattern layers. Since these two complementary pattern layers are formed separately on the different surfaces, each one has a better spatial resolution. The required precision can be easily achieved.

BRIEF DESCRIPTION OF DRAWINGS

The invention can be more fully understood by reading the following detailed description of the preferred embodiment, with reference made to the accompanying drawings as follows:

FIG. 4B is a bottom view schematically illustrating a conventional half-tone phase shifting mask, in which FIG. 4A is the cross-sectional view taken along the line III—III in FIG. 4A.

DETAILED DESCRIPTION OF PREFERRED EMBODIMENT

A double-sided photomask of the invention uses two complementary pattern layers respectively formed on each surface of a transparent substrate. A full pattern is a combined pattern of these two complementary pattern layers.

EXAMPLE 1

Figure 7:
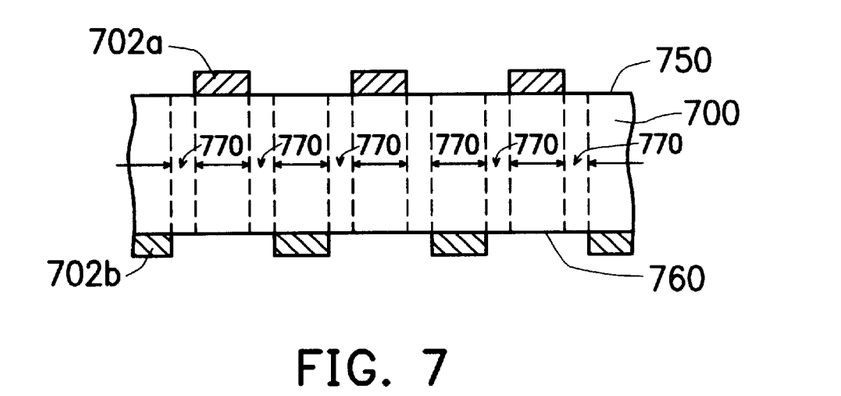
FIG. 7 is a cross-sectional view illustrating a general double-sided photomask, according to a first preferred embodiment of the invention.

FIG. 7 is a cross-sectional view illustrating a general double-sided photomask, according to a first preferred embodiment of the invention. A general double-sided photomask includes a transparent substrate 700 with a first surface 750 and a second surface 760. A first light-shielding layer 702a is formed on the first surface 750 and a second light-shielding layer 702b is formed, alternate to the positions of light-shielding layer 702a, on the surface 760. These two layers 702a, 702b are complementary to each other in that they form a full pattern and include a light-shielding material, such as chromium or a metal material, to shield light. An exposing region 770 is not shielded by the light-shielding layers 702a, 702b so that light rays can pass through the exposing region 770. The transparent substrate includes, for example, quartz or glass. In addition, an anti-reflection layer (not shown) to reduce light reflection during exposure is usually formed over the light-shielding layers 702a, 702b.

Figure 8A:
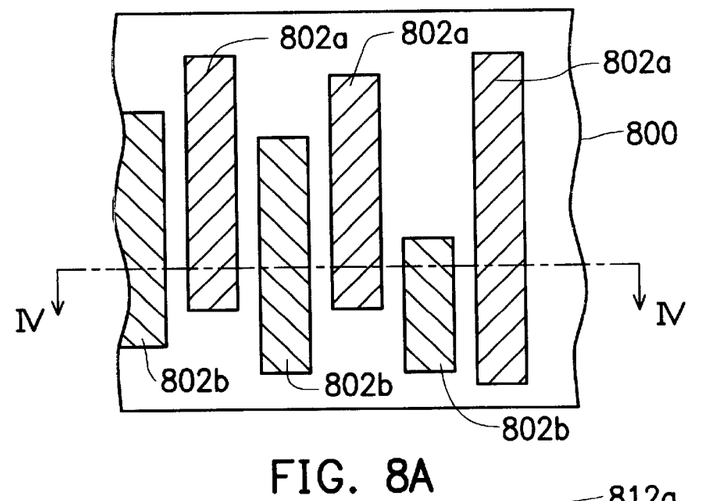
FIG. 8A is a bottom view illustrating a general line double-sided photomask, according to a first preferred embodiment of the invention.

FIG. 8A is a bottom view illustrating a general line double-sided photomask. Referring to FIG. 7 and FIG. 8A, a cross-sectional view taken along the line IV—IV in FIG. 8A can be schematically shown in FIG. 7. A transparent substrate 800, an upper line light-shielding layer 802a, and a lower line light-shielding layer 802b respectively correspond to the transparent substrate 700, the first light-shielding layer 702a, and the second light-shielding layer 702b. The upper line light-shielding layer 802a is formed on the first surface 750 seen in FIG. 7, and the lower line light-shielding layer 802b is formed on the second surface 760 seen in FIG. 7. The line light-shielding layers 802a, 802b each include, for example, a number of metal lines, which are alternatively set in parallel.

Figure 8B:
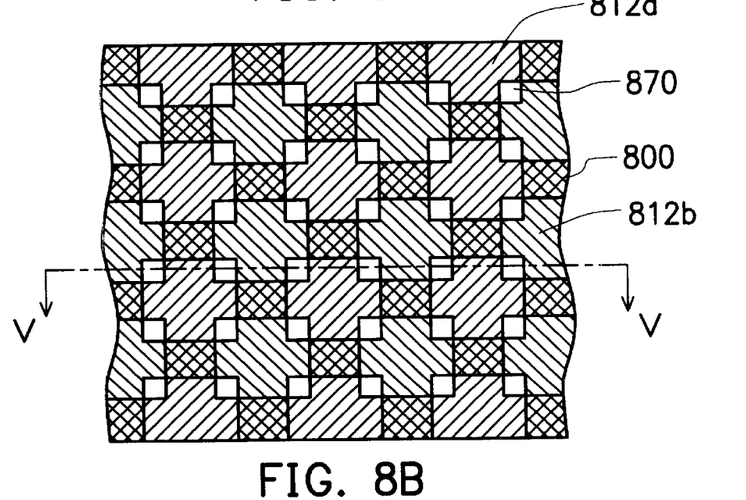
FIG. 8B is a bottom view illustrating a general hole double-sided photomask, according to a first preferred embodiment of the invention.

FIG. 8B is a bottom view illustrating a general hole double-sided photomask. Referring to FIG. 7 and FIG. 8B, a cross-sectional view taken along the line V—V in FIG. 8 can be schematically shown in FIG. 7. A transparent substrate 800, an upper light-shielding layer 812a, a lower light-shielding layer 812b, and an exposing region 870 respectively correspond to the transparent substrate 700, the first light-shielding layer 702a, the second light-shielding layer 702b, and the exposing region 770. The upper light-shielding layer 812a is formed on the first surface 750 seen in FIG. 7, and the lower light-shielding layer 812b is formed on the second surface 760 seen in FIG. 7. The line light-shielding layers 802a, 802b, each including a net-like structure, partially overlap and leave the exposing region 870 uncovered. A combined full pattern becomes a hole pattern to form the general hole double-sided photomask.

The above two types of the general double-sided photomask use two complementary light-shielding layers respectively formed on each surface of the transparent substrate. The two complementary light-shielding layers either partially overlap or are set in alternating positions without overlap. When the double-sided photomask is exposed to light, a full combined pattern is presented. Since the full combined pattern is separately created by two complementary light-shielding layers, the pattern density in each light-shielding layer is reduced. So, each light-shielding layer can be precisely and easily made to achieve precise control over the critical dimension in high-integration IC fabrication.

EXAMPLE 2

Figure 9:
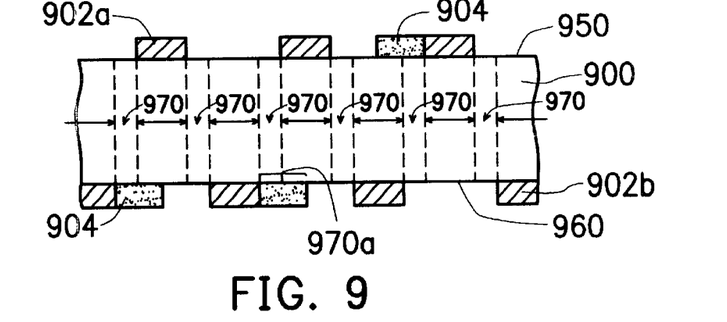
FIG. 9 is a cross-sectional view illustrating a double-sided alternating PSM, according to a second preferred embodiment of the invention.
Figure 10:
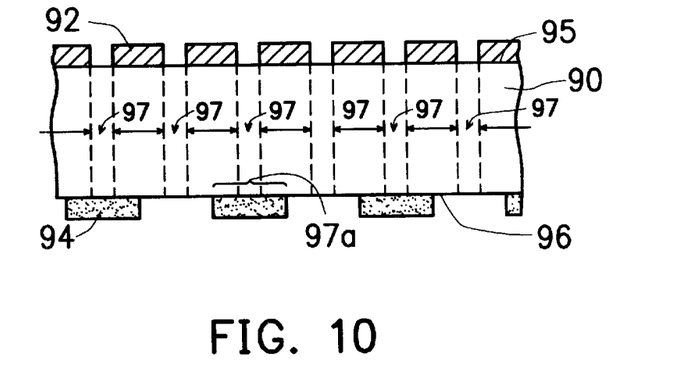
FIG. 10 is a cross-sectional view illustrating another double-sided alternating PSM, according to a second preferred embodiment of the invention.

The double-sided design is also suitable for the phase shifting mask (PSM). FIG. 9 is a cross-sectional view illustrating a first double-sided alternating PSM, according to a second preferred embodiment of the invention. FIG. 10 is a cross-sectional view illustrating a second double-sided alternating PSM, according to a second preferred embodiment of the invention.

In FIG. 9, a transparent substrate 900 including, for example, quartz or glass is the main body of the first double-sided alternating PSM. A first light-shielding layer 902a is formed on a first surface 950 of the transparent substrate 900, and a second light-shielding layer 902b is alternatively formed on a second surface of the transparent substrate 900. An exposing region 970 on the transparent substrate 900 is left without being covered by these two light-shielding layers 902a, 902b. These two light-shielding layers 902a, 902b include, for example, chromium or a metal material, and usually are coated with an anti-reflection layer (not shown). A shifter layer (not shown) can be formed as desired to cover the exposing region 970 or to fully cover all voids between the pattern in the light-shielding layers 902a, 902b. An example in the second preferred embodiment is that a shifter layer 904 is formed adjacent to the light-shielding layers 902a, 902b at a region 970a, which covers some of the exposing region 970 with some still being exposed. The region 970a at least includes the exposing region 970. Furthermore, the shifter layer 904 is divided into two parts, which are respectively formed on the first surface 950 and the second surface 960. The shifter layer 904 can be freely arranged as desired to cover the exposing region 970. This eases the fabrication of the shifter layer.

The shifter layer 904 is made by a usual shifter material as described in FIG. 3 with a property that can invert light wave phase. A compensation for the light wave amplitude occurs to increase the pattern resolution. Again, because the light-shielding layers 902a, 902b and the shifter layer 904 are fabricated on each surface of the transparent substrate 900, the pattern density is reduced. So a precise photomask can be achieved by the double-sided design of the invention.

In FIG. 10, the second double-sided alternating PSM is presented. A transparent substrate 90 including, for example, quartz or glass is the main body of the second double-sided alternating PSM. A light-shielding layer 92 is formed on a first surface 95 of the transparent substrate 90, and a shifter layer 94 is formed on a second surface 96 of the transparent substrate 90. An exposing region 97, which is not covered by the light-shielding layer 92, is presented in a number of exposing regions 97 sequentially located between the light-shielding layer 92 on the transparent substrate 90 in the cross-sectional view. The shifter layer 94 covers alternate exposing regions 97 within a region 97a, which at least includes the covered exposing regions 97. Since the properties of the shifter layer 94 are as described before, the light waves with normal phase interfere with the light waves with inverted phase due to passing the shifter layer 94. After compensation on the light wave amplitude at the critical region, the light intensity contrast is increased so that the resolution and precision of the pattern are increased.

In the example shown in FIG. 10, the shifter layer 94 is formed on the surface 96, which is flat. Thus, the shifter layer 94 has better step coverage and thickness uniformity than the conventional one shown in FIG. 3, in which the shifter layer 304 is directly formed over the exposing regions 308. The property of uniform thickness can also avoid incoherence in the shift angle. The thickness of any shifter layer is typically set to have a shift angle of 180° to the exposing light source.

EXAMPLE 3

Figure 11A:
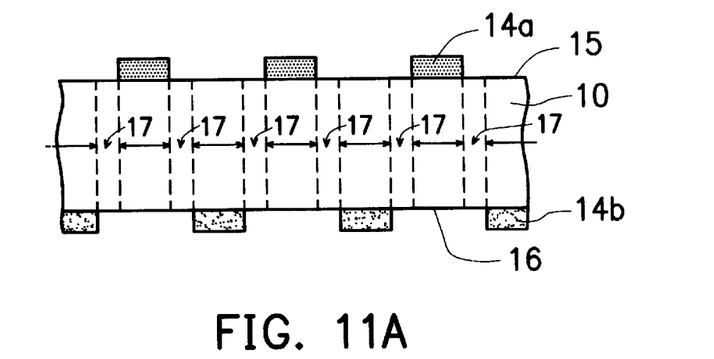
FIG. 11A is a cross-sectional view illustrating a double-sided half-tone PSM, according to a third preferred embodiment of the invention.
Figure 11B:
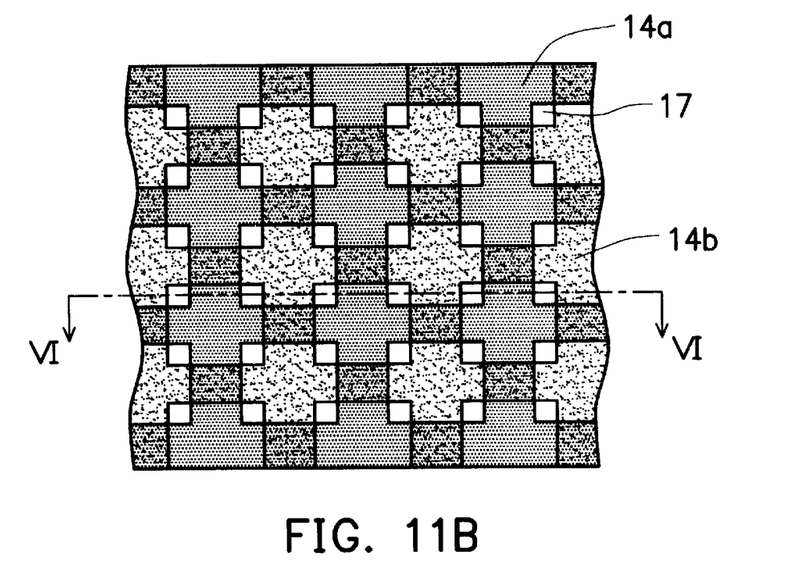
FIG. 11B is a bottom view illustrating the double-sided half-tone PSM, corresponding to the third preferred embodiment in FIG. 11A.

FIG. 11A is a cross-sectional view illustrating a double-sided half-tone PSM, according to a third preferred embodiment of the invention. FIG. 11B is a bottom view illustrating the double-sided half-tone PSM (HTPSM), in which FIG. 11A is, for example, viewed along the line VI—VI. In FIG. 11A and FIG. 11B, a transparent substrate 10 including, for example, quartz or glass is the main body of the double-sided half-tone PSM. A light-shielding layer 14a with a net-like structure is formed on a surface 15 of the transparent substrate 10. A shifter layer 14b with a net-like structure is formed on a surface 16 of the transparent substrate 10. The light-shielding layer 14a and the shifter layer 14b are partially overlapped to allow a number of square-hole exposing regions 17, which originate from voids between the net grids. When the HTPSM is exposed to the exposing light source, light passing through the exposing regions 17 has a normal light wave phase, and light passing through the shifter layer 14b has a negative light wave amplitude with a transmission coefficient of about 3–10%. The shifter layer 14b including, for example, $MoSi_ZO_XN_Y$ or $SiO_XN_Y$ can shift the light wave phase with a shift angle of 180° so that the light wave amplitude is negative and can compensate the normal phase light at the edge. The total effect is that the light intensity contrast of the pattern is increased to have a better pattern resolution.

The HTPSM described above is formed by the light-shielding layer 14a and the shifter layer 14b layer with partial overlap to obtain a desired pattern. Since the full combined pattern is separately done by two parts, the pattern density in the light-shielding layer 14a and the shifter layer 14b is loosed. So, each light-shielding layer can be precisely and easily made to achieve a precise control on the critical dimension in high-integration IC fabrication.

EXAMPLE 4

Figure 12:
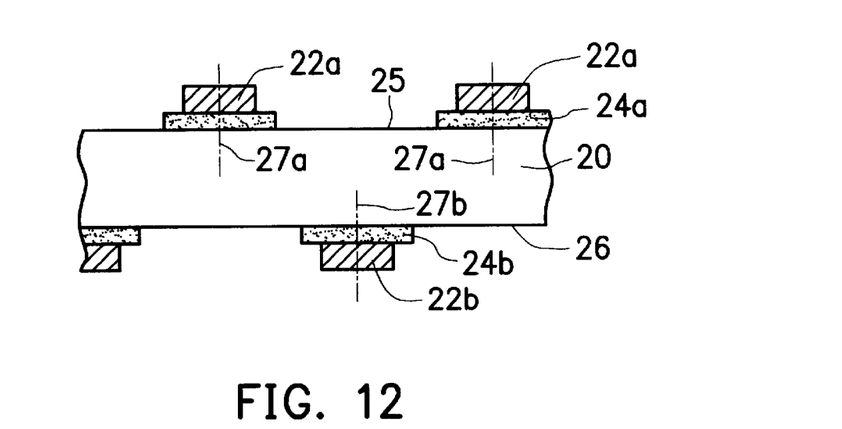
FIGS. 12–15 are cross-sectional views schematically illustrating a double-sided rim PSM, according to a fourth preferred embodiment of the invention.
Figure 13:
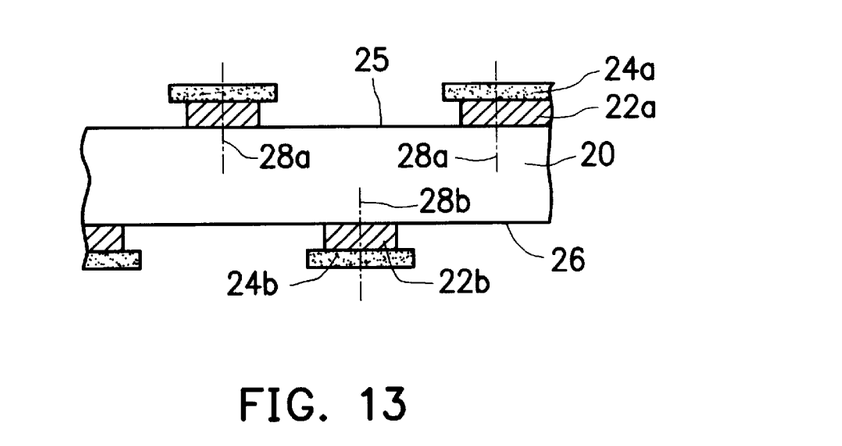
Figure 14:
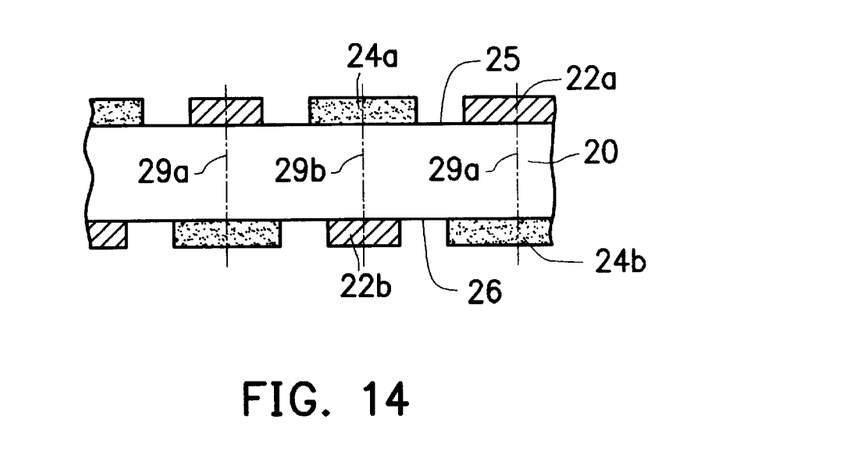

FIGS. 12–15 are the cross-sectional views schematically illustrating a double-sided rim PSM, according to a fourth preferred embodiment of the invention. In FIGS. 12–14, a transparent substrate 20 includes, for example, quartz or glass in the main body of the rim PSMs. Two surfaces 25 and 26 of the transparent substrate 20 provide the places for forming a desired pattern. Two light-shielding layers 22a and 22b are made of light shielding material such as chromium or metal. Two shifter layers 24a and 24b are made of shifter material such as $MoSi_ZO_XN_Y$ or $SiO_XN_Y$ and can shift the light wave phase by a shift angle of 180° to produce zero points between the normal phase light and the shifted phase light as explained in reference to FIG. 3.

In FIG. 12, the shifter layer 24a and the shifter layer 24b are respectively formed in alternating positions on the surface 25 and the surface 26, but without overlap. Then the light-shielding layer 22a and the light-shielding layer 22b are respectively located on the center of the shifter layer 24a and the shifter layer 24b with a same center line 27a and a same center line 27b but without fully covering the shifter layers 24a, 24b. The shape of the light-shielding layers 22a, 22b is, for example, similar to the shifter layers 24a, 24b. In this arrangement, when the double-sided rim PSM is exposed in a chosen exposing light, the light that doesn't pass through the shifter layer has a normal wave phase, the light that passes through the shifter layers 24a, 24b has an inverted wave phase, and the light that passes through the light-shielding layers 22a, 22b is fully shielded. The light with normal wave phase interferes with the light with inverted wave phase so that a zero point phenomenon occurs and the pattern resolution is thereby increased.

In FIG. 13, the light-shielding layer 22a and the light-shielding layer 22b are respectively formed in alternating positions on the surface 25 and the surface 26, but without overlap. Then the shifter layer 24a and the shifter layer 24b are respectively located on the center of the light-shielding layer 22a and the light-shielding layer 22b with a same center line 28a and a same center line 28b. The shifter layers 24a, 24b do not overlap each other but cover the light-shielding layers 22a, 22b. The shape of the shifter layers 24a, 24b is, for example, similar to the light-shielding layers 22a, 22b. In this arrangement, when the double-sided rim PSM is exposed in a chosen exposing light, the light that does not pass through the shifter layer has a normal wave phase, the light passing through the shifter layers 24a, 24b has an inverted wave phase, and the light passing through the light-shielding layers 22a, 22b is fully shielded. The light with normal wave phase interferes with the light with inverted wave phase so that a zero point phenomenon occurs and therefore the patter resolution is increased.

In FIG. 14, the light-shielding layer 22a and the light-shielding layer 22b are respectively located on the surface 25 and the surface 26, but without overlapping each other. The exposed region relative to the light-shielding layers 22a, 22b is formed by the shifter layer 24a and the shifter 24b on the surface 25 and the surface 26 with a matched center line 29a and a matched center line 29b, respectively. The shape of the shifter layers 24a, 24b are similar to the light-shielding layers 22a, 22b. In this arrangement, when the double-sided rim PSM is exposed in a chosen exposing light, the light not passing through the shifter layer has a normal wave phase, the light passing through the shifter layers 24a, 24b has an inverted wave phase, and the light passing through the light-shielding layers 22a, 22b is fully shielded. The light with normal wave phase interferes with the light with inverted wave phase so that a zero point phenomenon occurs and the patter resolution is thereby increased.

The above three examples of the double-sided rim PSM utilizes the two surfaces 25, 26 of the transparent substrate 20 to form the full desired pattern. Thus, there is a looser pattern density than that if all the light-shielding layers 24a, 24b and the light-shielding layers 22a, 22b are formed on one single surface. This allows the double rim PSM to be easily and precisely made in order to achieve a precise critical dimension control of the IC devices without tight limitations.

Figure 15:
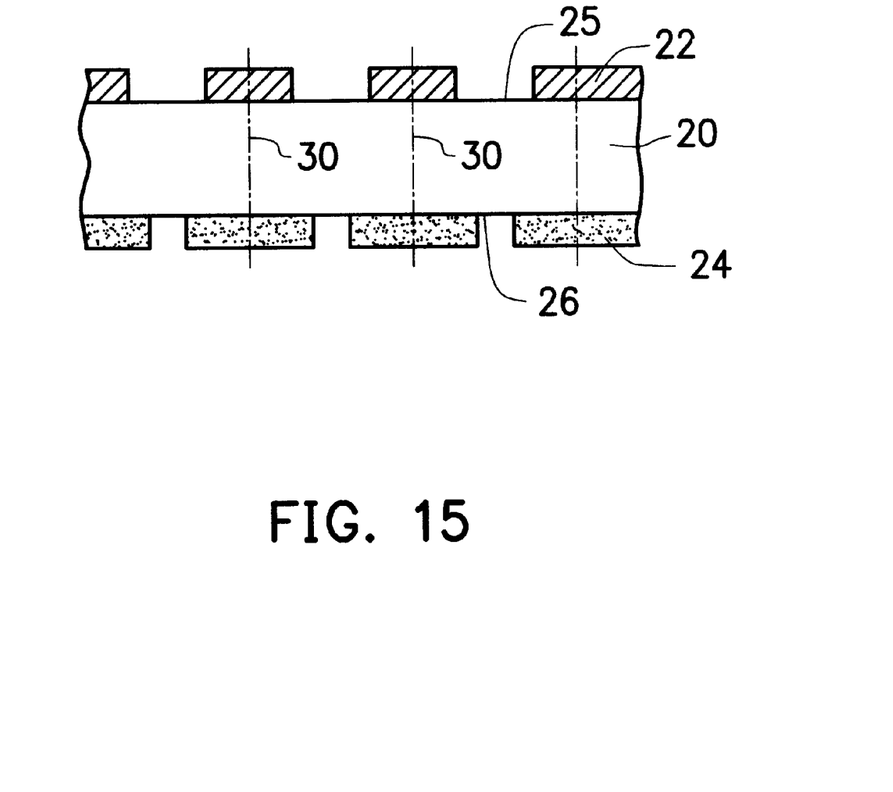

Another double-sided rim PSM is shown in FIG. 15. In FIG. 15, a light-shielding layer 22 is formed on one surface 25 of a transparent substrate 20, and a shifter layer 24 is formed on another surface 26 of the transparent substrate 20. The shape of the light-shielding layer 22 is similar to the shifter layer 24 except for the size, and thereby, for example, the shifter layer 24 overlaps the light-shielding layer 22 with a same center line 30 but has larger covering size on the surface 26. The shifter layer has the same properties as described before and inverts the light wave phase for the chosen exposing light.

Again, when this double-sided rim PSM is exposed in a chosen exposing light, the light without passing the shifter layer has a normal wave phase, the light passing the shifter layer 24 has the inverted wave phase, and the light passing the light-shielding layer 22 is fully shielded. The light with normal wave phase interferes with the light with inverted wave phase so that a zero point phenomenon occurs and the pattern resolution is thereby increased. Because the shifter layer 24 is formed on the surface 26, which is sufficiently flat, the quality of step coverage and the thickness uniformity of the shifter layer 24 are also improved.

Summarizing the double-sided rim PSM, two surfaces 25, 26 of the transparent substrate 20 are used to form the full desired pattern. Thus, there is a looser pattern density than if all the light-shielding layers are formed on one single surface. This allows the double rim PSM to be easily and precisely made in order to achieve a precise critical dimension control of the IC devices without tight limitations.

Figure 16:
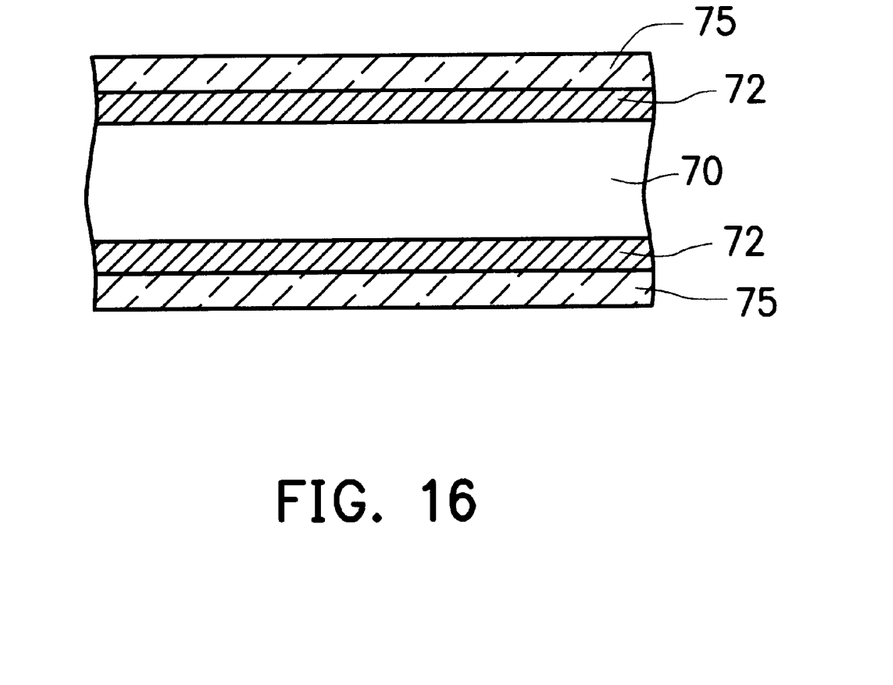
FIG. 16 is a cross-sectional view schematically illustrating a semi-manufacture of the general double-sided photomask.

Moreover, a semi-manufacture of a general double-sided photomask is shown in FIG. 16. It includes a transparent substrate 70, a light-shielding layer 72 over each surface of the transparent substrate 70, and a photoresist layer 75 coated over the light-shielding layer 72. The light-shielding layer 72 can be patterned to have the desired pattern by patterning the photoresist layer 75 with the desired pattern.

Figure 17:
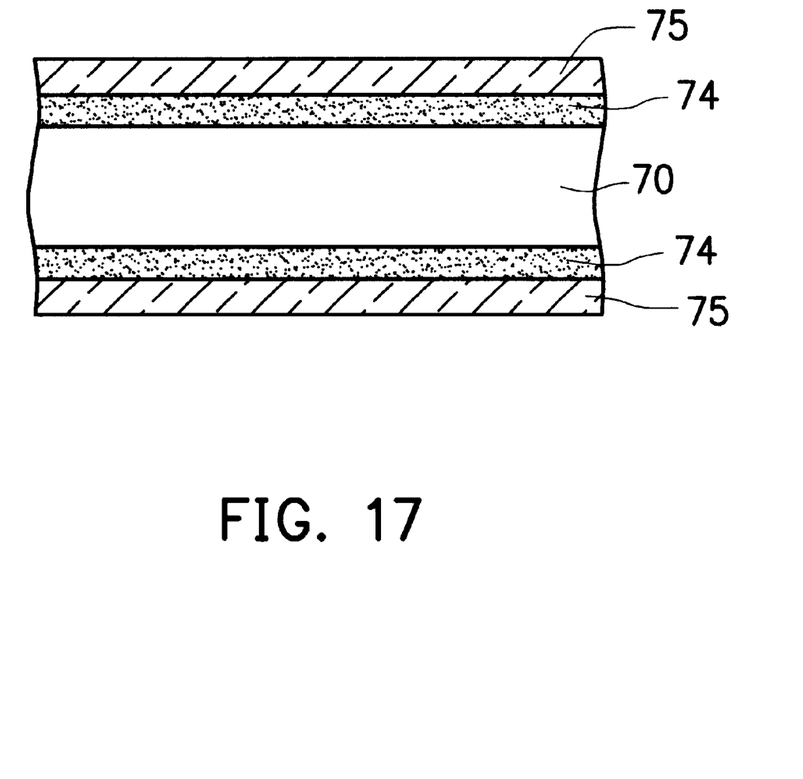
FIG. 17 and FIG. 18 are a cross-sectional view schematically illustrating a semi-manufacture of two double-sided PSMs.

FIG. 17 shows a semi-manufacture of a PSM. It includes a transparent substrate 70, a shifter layer 74 over each surface of the transparent substrate 70, and a photoresist layer 75 coated over the shifter layer 74.

Figure 18:
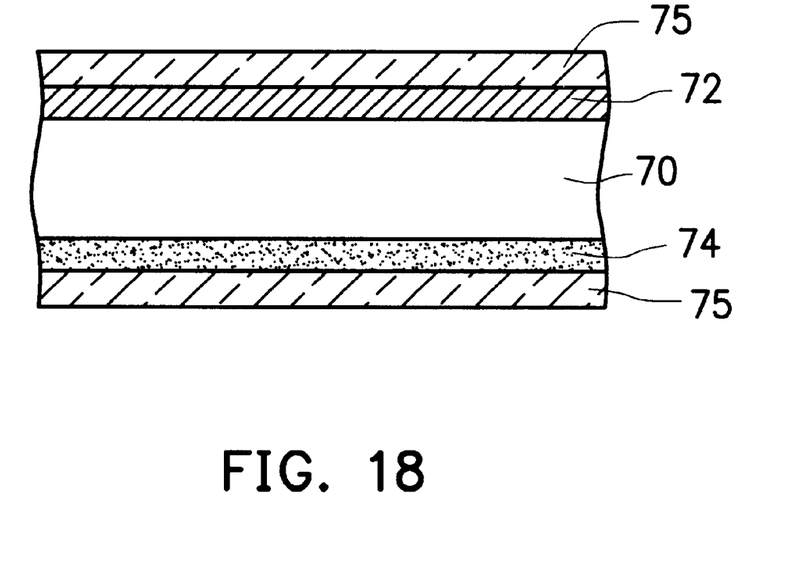

FIG. 18 shows a semi-manufacture of another PSM. It includes a transparent substrate 70, a light-shielding layer 72 formed over one surface of the transparent substrate 70, a shifter layer 74 formed over another surface of the transparent substrate 70, and a photoresist layer 75 coated over the transparent substrate 70 on both the light-shielding layer 72 and the shifter layer 74. In all the above semi-manufactures, the transparent substrate 70 includes, for example, quartz or glass. The light-shielding layer 72 includes, for example, chromium. The shifter layer 74 including, for example, $SiO_XN_Y$ or $MoSi_ZO_XN_Y$ can shift the light wave phase by a shifter angle of 180°.

These three semi-manufactures can be provided by manufacturers with a good thickness uniformity of the light-shielding layer 72, the shifter layer 74, and the photoresist layer 75.

In conclusion, the double-sided design of the photomask utilizes two flat surfaces of the transparent substrate for forming the desired pattern. Since it has more available space, the spatial pattern density is reduced, and therefore a more precise and easier fabrication of the photomask is possible. This allows the critical dimension to be precisely controlled and lessens the difficulty and limitations of IC fabrications.

The double-sided design is suitable for various photomask designs such as the typical photomask or the PSM. The desired pattern is divided into two parts distributed on the two surfaces either through an overlapping method or an alternating set method. When the double-sided photomask is exposed to light, the desired pattern is composed of these two parts of the double-sided photomask.

The shifter layer used in the PSM type is formed on the flat surface of the transparent substrate so the step coverage and the thickness uniformity are improved.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A double-sided photomask to pattern a pattern, the double-sided photomask comprising:
    a transparent substrate having a first surface and a second surface;
    a first light-shielding pattern layer on the first surface of the transparent substrate; and
    a second light-shielding pattern layer on the second surface of the transparent substrate, wherein the first light-shielding pattern layer and the second light-shielding pattern layer are arranged in alternating positions.

2. The double-sided photomask of claim 1, wherein the first light-shielding pattern layer and the second light-shielding pattern layer comprise chromium.

3. The double-sided photomask of claim 1, wherein the first light-shielding pattern layer and the second light-shielding pattern layer comprise a linear shape.

4. The double-sided photomask of claim 3, wherein the photomask further comprises a shifter layer to cover a portion of a region without being covered by the first light-shielding pattern layer and the second light-shielding pattern layer, in which the shifter layer comprises a shifter material to shift a wave phase of exposing light by a shift angle of 180° and is distributed on the first surface and the second surface.

5. The double-sided photomask of claim 4, wherein the shifter layer comprises a shifter material adapted to shift a wave phase of exposing light by a shift angle of 180°.

6. The double-sided photomask of claim 1, wherein the photomask further comprises:
    a first shifter layer with a shape similar to the first pattern layer but with a larger size, the first shifter layer being interposed between the transparent substrate and the first light-shielding pattern layer along a matched center line; and
    a second shifter layer with a similar shape to the first pattern layer but with a larger size, the second shifter layer being interposed between the transparent substrate and the second light-shielding pattern layer along a matched center line.

7. The double-sided photomask of claim 6, wherein the first shifter layer and the second shift layer are adapted to a wave phase of exposing light by a shift angle of 180°.

8. The double-sided photomask of claim 1, wherein the photomask further comprises:
    a first shifter layer on the first surface with a similar shape to the second pattern layer but with a larger size, the first shifter layer being matched along a same center line of the second light-shielding pattern layer; and
    a second shifter layer on the second surface with a similar shape to the first pattern layer but with a larger size, the second shifter layer being matched along a same center line of the first light-shielding pattern layer.

9. The double-sided photomask of claim 8, wherein the first shifter layer and the second shift layer are adapted to a wave phase of exposing light by a shift angle of 180°.

10. The double-sided photomask of claim 1, wherein the photomask further comprises:
    a first shifter layer on the first pattern layer along a matched center line, the first shifter layer having a shape similar to the first pattern layer larger in size; and
    a second shifter layer on the second pattern layer along a matched center line, the second shifter layer having a shape similar to the second pattern layer but larger in size.

11. The double-sided photomask of claim 10, wherein the first shifter layer and the second shift layer are adapted to a wave phase of exposing light by a shift angle of 180°.

12. A semi-manufacture of a double-sided photomask comprising:
    a transparent substrate having a first surface and a second surface;
    a first light-shielding layer over the first surface;
    a second light-shielding layer over the second surface;
    a first photoresist layer positioned over the first light-shielding layer; and
    a second photoresist layer positioned over the second light-shielding layer.

13. A semi-manufacture of a double-sided photomask comprising:
    a transparent substrate having a first surface and a second surface;
    a first shifter layer over the first surface to shift a wave phase of exposing light by a shift angle of 180°;
    a second shifter layer over the second surface to shift a wave phase of exposing light by a shift angle of 180°;
    a first photoresist layer positioned over the first shifter layer; and
    a second photoresist layer positioned over the second shifter layer.

14. A semi-manufacture of a double-sided photomask comprising:
    a transparent substrate having a first surface and a second surface;
    a light-shielding layer over the first surface;
    a shifter layer over the second surface to shift a wave phase of exposing light by a shift angle of 180°;
    a first photoresist layer positioned over the light-shielding layer; and
    a second photoresist layer positioned over the shifter layer.

15. A double-sided photomask to pattern a pattern, comprising:
    a transparent substrate having a first surface and a second surface;
    a first pattern layer on the first surface of the transparent substrate; and
    a second pattern layer on the second surface of the transparent substrate, wherein the first and the second pattern layers each comprises a light shielding material and are arranged as net-like structures that partially overlap each other.

16. A double-sided photomask to pattern a pattern, comprising:
   a transparent substrate having a first surface and a second surface;
   a first pattern layer on the first surface of the transparent substrate; and
   a second pattern layer on the second surface of the transparent substrate, wherein the first and the second pattern layers each comprises a shift material and are arranged as net-like structures that partially overlap each other.

17. The double-sided photomask of claim 16, wherein the first pattern layer and the second pattern layer are adapted to shift a wave phase of exposing light by a shift angle of 180°.

* * * * *